United States Patent
Gotoh et al.

(10) Patent No.: US 6,263,565 B1
(45) Date of Patent: *Jul. 24, 2001

(54) METHOD OF MANUFACTURING A SUBSTRATE HAVING ELECTRODE ARCS FOR CONNECTING TO SURFACE-MOUNTED ELECTRONIC PARTS AND SUBSTRATE MANUFACTURED BY SAME

(75) Inventors: Masashi Gotoh; Jitsuo Kanazawa, both of Ibaraki; Syuichiro Yamamoto, Chiba; Kenji Honda, Ibaraki, all of (JP)

(73) Assignee: TDK Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/103,392

(22) Filed: Jun. 24, 1998

(30) Foreign Application Priority Data

Jun. 24, 1997 (JP) .................................... 9-181817

(51) Int. Cl.⁷ ..................................... H01K 3/10
(52) U.S. Cl. .............................. 29/852; 29/412; 29/414; 29/846; 83/929.1; 174/262
(58) Field of Search ................... 29/412, 413, 414, 29/832, 846, 852; 174/262; 83/929.1, 929.2

(56) References Cited

U.S. PATENT DOCUMENTS 5,832,600 * 11/1998 Hashimoto ............................ 29/841

FOREIGN PATENT DOCUMENTS

| 2 248 345 | 4/1992 | (GB) . |
| 2-213196 | 8/1990 | (JP) . |
| 5-275561 | 10/1993 | (JP) . |
| 5-327156 | 12/1993 | (JP) . |
| 6-53775 | 2/1994 | (JP) . |
| 10-126034 | 5/1998 | (JP) . |

OTHER PUBLICATIONS

Patent Abstracts of Japan, vol. 14, No. 511 (E–0999), Nov. 8, 1990, JP 02 213196, Aug. 24, 1990.

Patent Abstracts of Japan, vol. 11, No. 288 (E–542), Sep. 17, 1987, JP 62 086846, Apr. 21, 1987.

Patent Abstracts of Japan, vol. 18, No. 545 (E–1617), Oct. 18, 1994, JP 06 196857, Jul. 15, 1994.

Patent Abstracts of Japan, vol. 14, No. 139 (E–0903), Mar. 15, 1990, JP 02 003999, Jan. 9, 1990.

* cited by examiner

*Primary Examiner*—Lee Young
*Assistant Examiner*—Rick Kiltae Chang
(74) *Attorney, Agent, or Firm*—Oblon, Spivak, McClelland, Maier & Neustadt, P.C.

(57) ABSTRACT

A through hole 5 formed in a substrate and having an electrode film on an inner surface thereof is cut and divided into two through holes or blind holes each of substantially semicircular arc shape through dicing processing using a rotating blade, and one of the-divided through holes 5 of substantially semicircular arc shape is used as an external connection terminal 3 of substantially semicircular concave arc shape thereby to form a surface mounted electronic parts having a plurality of the external connection terminals 3. The height H of the substantially semicircular arc formed at an inner surface of each of the external connection terminals is set to be equal to or smaller than a value obtained by subtracting twice a thickness t of the electrode film from a radius R of a curvature of the arc.

10 Claims, 4 Drawing Sheets

METHOD OF MANUFACTURING A SUBSTRATE HAVING ELECTRODE ARCS FOR CONNECTING TO SURFACE-MOUNTED ELECTRONIC PARTS AND SUBSTRATE MANUFACTURED BY SAME

BACKGROUND OF THE INVENTION

The present invention relates to a surface mounted (SMD) electronic parts capable of being surface-mounted on a circuit board for an electronic device and a method for manufacture therefore. More particularly, relates to the terminal structure of the small-sized surface mounted electronic parts in which a through hole or a blind hole having an electrode film on an inner surface thereof is cut by the dicing processing to form an external connection terminal of substantially semicircular concave arc shape.

There is a known technique that many same electronic parts functions are formed on a substrate made from resin or the like, through hole electrodes or blind hole electrodes are formed at the boundary portions of the electronic parts functions, and the many same electronic parts functions are divided with reference to the center lines of the through holes or blind holes to form respective electronic parts. However, the miniaturization of the electronic parts has been demanded in the market and further due to the following reasons, there are many cases that the dividing processing must be performed by means of dicing cutting processing using a blade rotating at a high speed.

That is, there has arisen needs for reducing the diameter of a through hole (or blind hole); and since the external connection terminal formed by dividing the through hole (or blind hole) having an electrode film formed on an inner wall thereof through plating processing is required to have stable connection quality even with a small connection (formed through soldering in general) area, the terminal is required to have high shape accuracy and-high surface accuracy.

As other dividing processings, there are the bending processing (chocolate breaking processing), end milling processing (router processing), press cutting processing, or the like. However, in many cases, such other dividing processings are not suitable in view points of quality and economy as the dividing processing for dividing a small and precise electronic parts chip.

Conventionally, at the time of cutting and dividing a substrate on which many same electronic parts functions are formed, there has been employed a method and structure that the through hole (or blind hole) is cut into two parts each forming a just semicircular shape or that the through hole (or blind hole) is cut by making the center position of the through hole (or blind hole) coincide with the center position of the blade thickness of the cutting blade thereby to use the both of the divided electrode films of the through hole (or blind hole) as the electrode of the products (electronic parts).

However, according to such a method or structure that the through hole (or blind hole) is cut into two parts each forming a just semicircular shape or a method or structure that the through hole (or blind hole) is cut by making the center position of the through hole (or blind hole) coincide with the center position of the blade thickness of the cutting blade, burr is likely generated at the cross section of the electrode film, that is, the metal film formed through plating processing on the inner-surface of the through hole and so it is difficult to obtain precise and uniform cross section. The quality of the connection portion at the time of connecting the electronic parts (through the soldering process or the like) to the external circuit is degraded due to the burr generated at the cross section, that is, the surface of the external connection terminal. Further, since the burrs are mechanically unstable, some of burrs may be come off by applying slight force thereto despite that some of burrs are tightly adhered to the terminal surface. The burr thus come off may cause such a problem that the burr short-circuits the patterns of the circuit board of the various types of devices on which electronic parts are mounted thereby to degrade the entire reliability of the device.

The known document Japanese Patent Publication 2-213196 proposes a manufacturing method of a substrate having through holes at the end surfaces thereof, in that a through hole and a substrate are divided without causing the chip off or cracking of the plated layer formed on the inner surface of the through hole. However, such a method requires, in a process preceding to the dividing process of the substrate by using a die, a process of removing the plated layer formed on the inner wall of a through hole at the non-product side by means of the boring process, and so the manufacturing process is complicated.

SUMMARY OF THE INVENTION

An object of the present invention is to provide a surface mounted electronic parts having an accurate and homogeneous external connection terminal capable of suppressing or minimizing the generation of burr at an electrode film of a through hole or blind hole by making the substantially semicircular concave arc shape of the external connection terminal smaller than half of the circular shape of the through hole or blind hole.

In order to achieve the aforesaid object, a manufacturing method of a surface mounted electronic parts according to the present invention comprises the steps of: forming a plurality of electronic parts mounted on an insulating substrate; forming a plurality of through holes or blind holes at boundary portions; forming an electrode film on an inner surface of each of through holes or blind holes; cutting an dividing each of the through holes or the blind holes into two of substantially semicircular arc shapes through dicing processing using a rotating blade, in that a center of the rotating blade is shifted from a center of the through holes or the blind holes toward the parts side; and forming an external connection terminal of substantially semicircular concave arc shape by using one of the divided through holes or blind holes of substantially semicircular arc shape.

Further, according to the present invention, in a manufacturing method, an amount of the shift of the cutting blade is larger than 30 μm.

Furthermore, according to the present invention, in a manufacturing method, an amount of the shift of the cutting blade is larger than 30 μm, and less than 70% of a radius of the through holes or the blind holes.

Moreover, according to the present invention, in a manufacturing method, a thickness of the electrode film is in a range from 10 to 30 μm.

Still further, according to the present invention, in a manufacturing method, the cutting blade has a thickness is in a range from 30 to 60 μm.

DETAILED DESCRIPTION OF THE PREFERRED EMBODIMENTS

An embodiments of a surface mounted electronic parts according to the present invention will be described with reference to the accompanying drawings.

Figure 1:
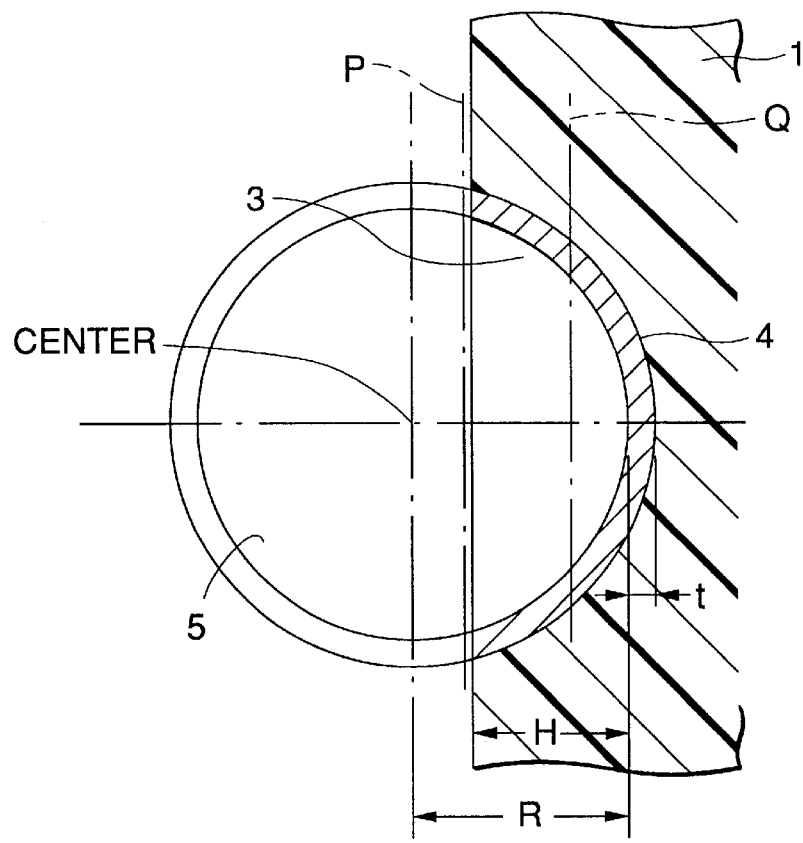
FIG. 1 is an enlarged plan view showing a main part of a surface mounted electronic parts according to an embodiment of the present invention.
Figure 2:
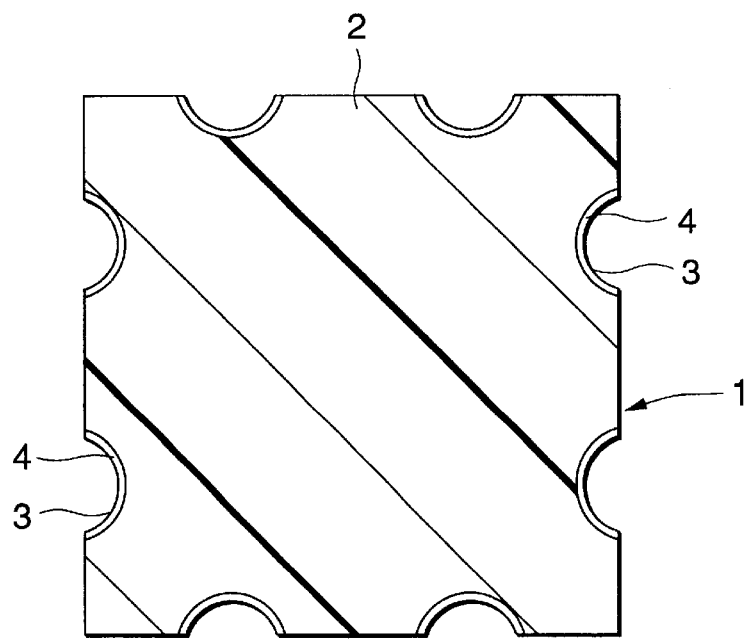
FIG. 2 is a plan view showing an entire configuration of a surface mounted electronic parts according to an embodiment of the present invention.

FIGS. 1 and 2 are diagrams showing the surface mounted electronic parts according to the embodiment. In FIG. 2 showing the entire configuration of the surface mounted electronic parts, a reference numeral 1 depicts a surface mounted electronic parts (SMD electronic parts) which is formed in a manner that many same electronic parts functions such as resistor, capacitor or the like are formed on a resin substrate and the substrate is cut and divided through dicing processing using a rotating blade. At the periphery of the resin substrate 2, a plurality of external connection terminals 3 of substantially semicircular concave arc shape are formed each of which is formed by cutting and dividing a through hole 5 having an electrode film 4 on the inner wall thereof through the dicing processing using the rotating blade.

As shown in an enlarged diagram of the electronic parts in FIG. 1, each of the external connection terminals 3 of substantially semicircular concave arc shape is arranged in a manner that the height H of the substantially semicircular concave arc thereof is equal to a value obtained by subtracting an amount of shifting of the cutting blade from the radius R of the curvature of the arc (that is, the radius of the through hole 5 before dividing). Preferably, the amount of the shift of the cutting blade is larger than 30 μm. Further, the height H of the substantially semicircular concave arc is not less than 30% of the radius R of the curvature of the arc. In other words, the height H of the substantially semicircular concave arc is set to be in a range sandwiched by a straight line P representing where the amount of the shift of the cutting blade being 30 μm and a straight line Q representing H=0.3 R.

The electrode film 4 is a metal plated film having a lower layer, an intermediate layer and an upper layer respectively formed by sequentially depositing Cu, Ni and Au on the inner wall of the through hole. When the inner diameter (2 R) of the through hole 5 is in a range of about 0.3 to 0.5 mm, the thickness of the electrode film 4 is in a range of 10 to 30 μm.

The reason why the height H of the substantially semicircular concave arc of the external connection terminal 3 is set to be in a range sandwiched by a straight line P representing where the amount of the shift of the cutting blade being 30 μm and a straight line Q representing H=0.3 R will be explained with reference to FIGS. 3 to 5.

Figure 3:
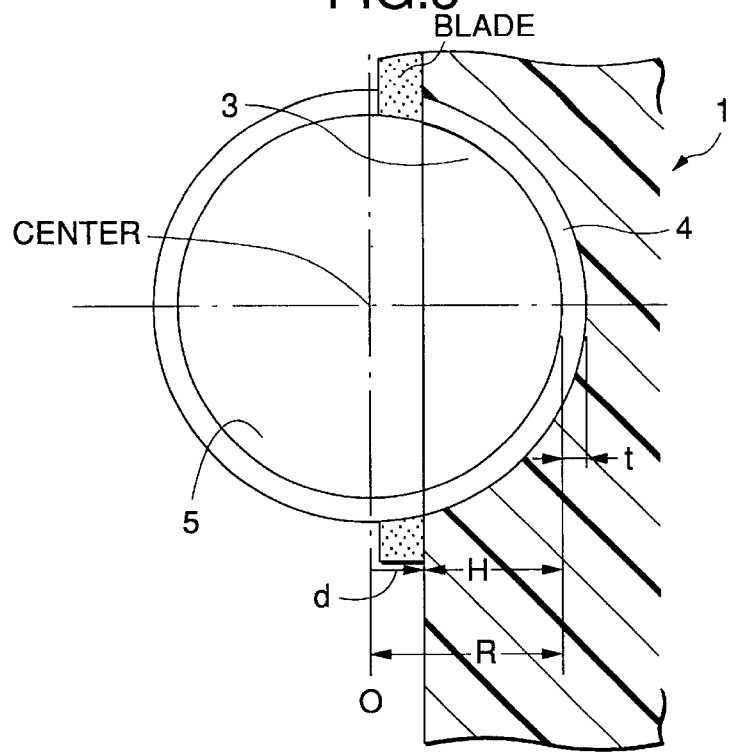
FIG. 3 is an explanatory diagram showing a process of cutting and dividing a substrate provided with through holes each having an electrode film on the inner wall thereof through dicing processing using a rotating blade.

In FIG. 3, the cutting position d of the through hole 5 is defined as the distance from the straight line O for dividing the through hole 5 into two parts accurately to the position where the connection terminal is cut (such that the value of the cutting position is positive when the cutting position is on the parts side from the straight line O). When the inventors of the present invention investigated the relation between the cutting positions d and burr generation rates, the relation shown in FIG. 4 was obtained. In the figure, an example (a) is a case where the cutting position d is −0.06 mm, an example (b) is a case where the cutting position d is 0.00 mm and coincides with the straight line O for dividing the through hole 5 into two parts accurately, an example (c) is a case where the cutting position d is 0.03 mm, an example (d) is a case where the cutting position d is 0.06 mm, and an example (e) is a case where the cutting position d is 0.15 mm. The number of samples in each of the examples (a) to (e) is 250 and so total number of the samples is 1,250. Samples in which burr larger than the thickness 30 μm of the electrode film are generated are recognized as defective samples due to burr. At the cutting position of the example (a), the number of samples (defective samples) in which burr larger than 30 μm is generated is 242 and so the burr generation rate is 97%. At the cutting position of the example (b), the number of samples in which burr larger than 30 μm is generated is 70 and so the burr generation rate is 28%. At the cutting position of the example (c), the number of samples in which burr larger than 30 μm is generated is 30 and so the burr generation rate is 12%. At each of the cutting positions of the examples (d) and (e), the number of samples in which burr larger than 30 μm is generated is 0 and so the burr generation rate is 0%. In the aforesaid examples, the through holes are cut under such a condition that the diameter of the cutting blade is 54 mm, the rotation speed of the cutting blade is 15,000 rpm, the cutting speed is 10 mm/sec, and the thickness of the cutting blade is 60 μm. The through hole is shaped to have the inner diameter (diameter 2 R) of 0.5 mm, the thickness t of the electrode film 4 (three layered plated film of Cu, Ni and Au) is 30 μm and the base material of the through hole is the resin wiring substrate (thickness thereof is 0.5 mm).

The aforesaid cutting condition except for the cutting position d is optimum condition decided by sufficiently investigating the cutting condition and the burr generation rate. It is considered that the smaller thickness of the cutting blade is, the smaller the generation rate of burr becomes. However, it will be clear from the aforesaid examples that there is little difference in the generation rate of burr between the cutting blade thickness of 60 μm and 30 μm, and so there is no problem as to the generation of burr so long as the normally-used cutting blade with the thickness equal to or less than 60 μm is used.

FIG. 5 is explanatory diagrams showing the changes of the generation states of burr depending on the cutting positions d, wherein the cross sections of the external connection terminal 3 of substantially semicircular concave arc shape of the surface mounted electronic parts 1 are viewed.

Figure 5A:
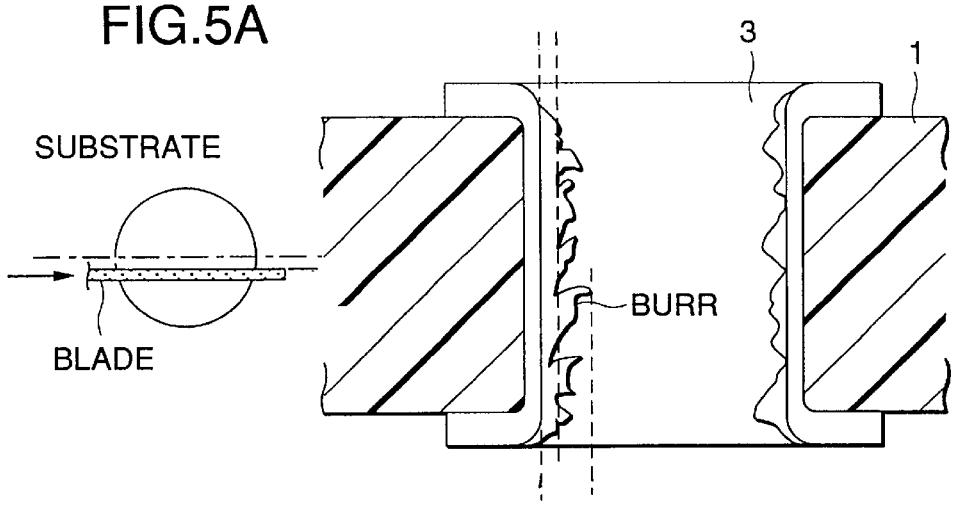
FIGS. 5A to 5C are explanatory diagrams showing generation states of burr depending on the cutting positions in the embodiment.

FIG. 5A shows the generation state of burr when the cutting position d is −0.06 mm in the example (a). In this case, the burr generation rate, that is, the defective sample generation rate (generation rate of burr larger than the thickness 30 μm of the electrode film) is 97% and an average size of burr is 49 μm. The size of burr (burr amount) is a size of largest burr to the center direction of the through hole among all the samples in each example.

Figure 5B:
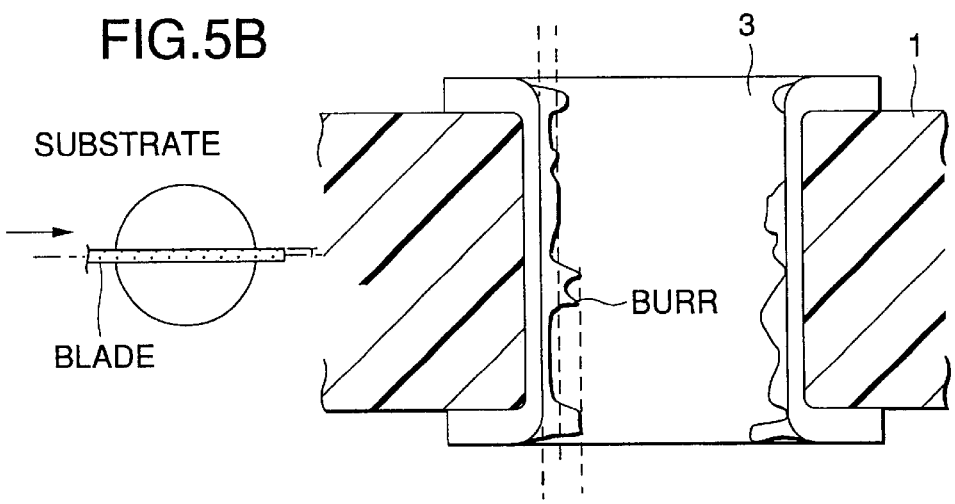

FIG. 5B shows the generation state of burr when the cutting position d is 0.03 mm in the example (c). In this case, the defective sample generation rate (generation rate of burr larger than the thickness 30 μm of the electrode film) is 12% and an average size of burr is 23 μm.

Figure 5C:
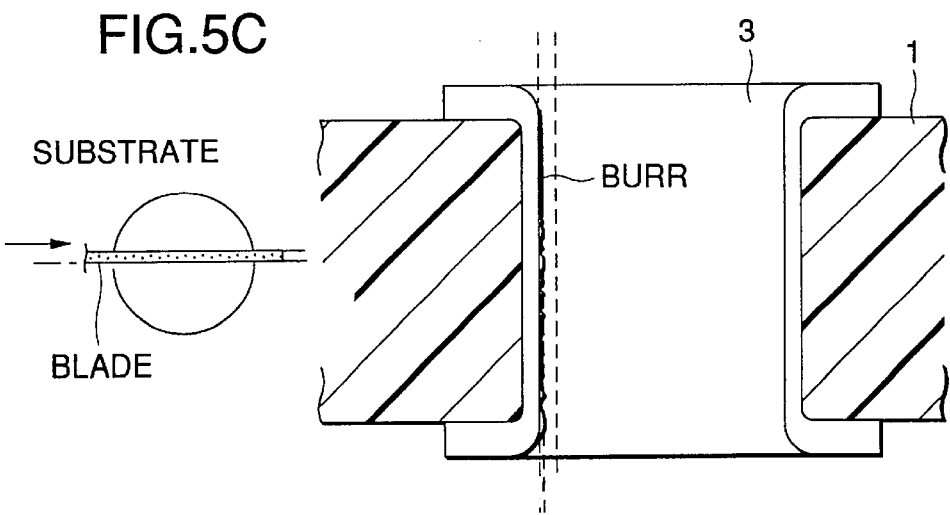

FIG. 5C shows the generation state of burr when the cutting position d is 0.06 mm in the example (d). In this case, the defective sample generation rate (generation rate of burr larger than the thickness 30 µm of the electrode film) is 0% and an average size of burr is 2 µm.

Figure 4:
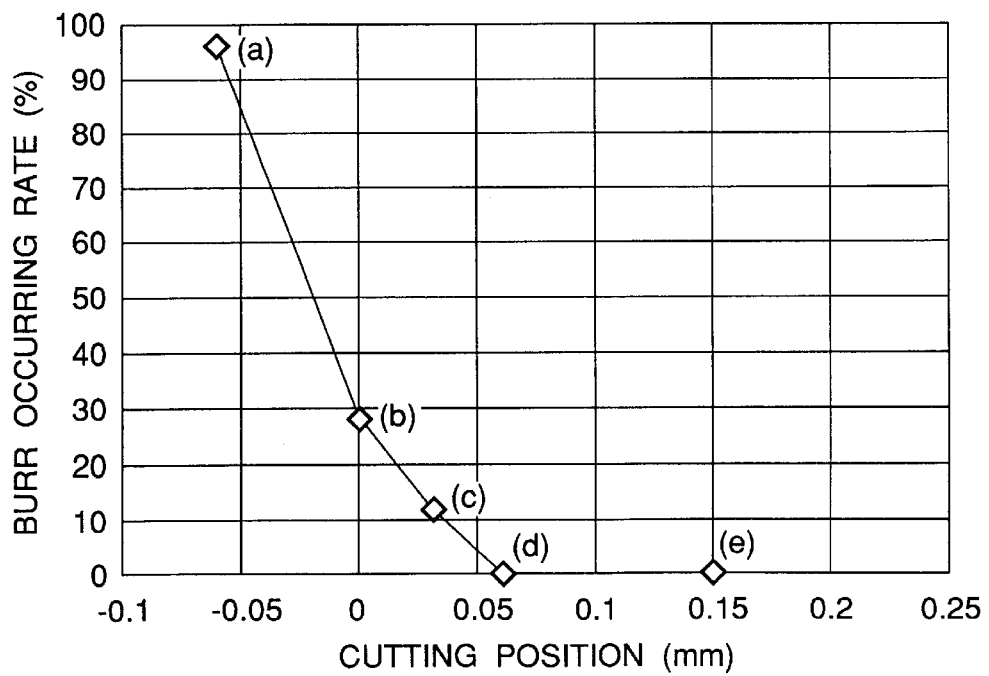
FIG. 4 is a graph showing a relation between cutting positions and burr generation rates in the embodiment.

In view of the burr generation rates and the burr generation states shown in FIGS. 4 and 5, when the cutting position d is deviated not less than 0.06 mm to the parts side with reference to the straight line O for dividing the through hole 5 into two parts accurately, that is, when the center of the cutting blade is shifted from the center of the through center to the parts side, the burr generation rate becomes 0. In the above case, the center of the cutting blade is shifted by 30 µm from the center of the through-hole. Thus, in this case a surface mounted electronic parts having the external connection terminals 3 of substantially semicircular concave arc shape with no burr can be obtained.

According to the aforesaid explanation, it will be understood that the burr generation rates can be suppressed to 0 if the center of the cutting blade is shifted from the center of the through hole. In view of only the reduction of the burr generation rate, the height H of the substantially semicircular concave arc of the external connection terminal 3 can be made as small as possible. However, if the height H of the substantially semicircular concave arc becomes too small (that is, the cutting position d becomes too large), the connection area of the external connection terminal 3 for the external circuit becomes smaller in accordance with the reduction of the height, so that the connection intensity of the external connection terminals 3 also reduces. The practically possible reduced size of the connection area is determined depending on the number of the terminals provided at the electronic parts and the device in which the electronic parts are used. Although the size of the connection area can be selected freely so long as such a condition is satisfied, the external connection terminal can be used sufficiently so long as the area sandwiched between the cutting position and the inner periphery of the electrode film (that is, inner peripheral area) is not smaller than ½ of the inner peripheral area obtained by divining the through hole by two.

Figure 6:
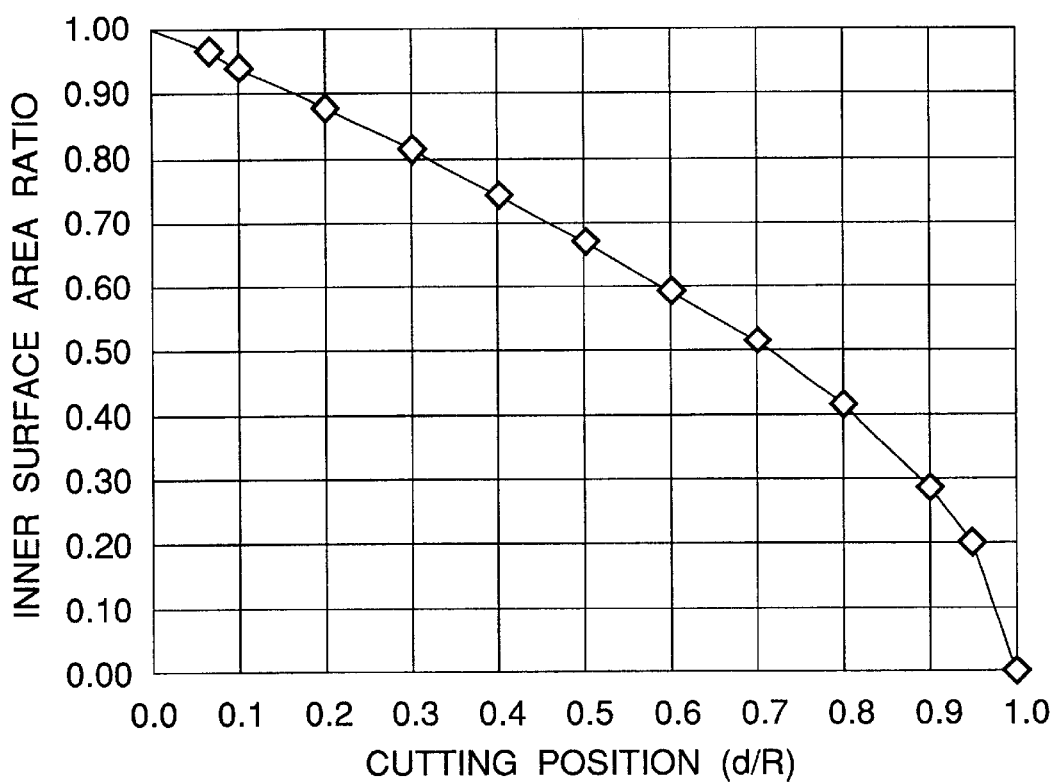
FIG. 6 is a graph showing the relation between cutting position ratios (d/R) and inner peripheral area ratios of the external connection terminal.

FIG. 6 is a graph showing the relation between cutting position ratios (d/R) and inner peripheral area ratios, in which an ordinate represents the cutting position ratio d/radius R and an abscissa represents the inner peripheral area ratio which is a ratio of the inner peripheral area of the external connection terminal at the cutting position ratio d/R with respect to the area of half of the through hole (that is, the area between the straight line O and the inner periphery of the electrode film). Since the height H of the substantially semicircular concave arc is R-d, the cutting position d where the inner peripheral area ratio becomes ½ is 0.7 R, that is, the position where H=0.3 R. As a consequence, if the height H of the substantially semicircular concave arc is not less than 30% of the radius R of the curvature of the substantially semicircular concave arc, the obtained connection area of the external connection terminal 3 is not less than ½ of the inner peripheral area obtained by divining the through hole by two. As a consequence, practically sufficient connection intensity can be ensured.

According to the aforesaid embodiment, the following technical advantages can be obtained.

As shown in FIG. 4, the burr generation rate changes abruptly when the cutting position d approaches to the position for dividing the through hole into two parts accurately. It is possible to provide the external connection terminal 3 having no burr by setting the cutting position to the external connection terminal 3 side, that is, to the position slightly to the parts side. More concretely, the center of the cutting blade is shifted to the parts side by at least 60 µm from the center of the through hole. The cutting condition described in the aforesaid embodiment is set so that the generated burr becomes minimum at the same cutting position. Accordingly, if the cutting condition thus set is not suitable, the burr generation rate may not be 0 even at the cutting position where the burr generation rate should be 0 in the graph of FIG. 4. However, the relation between the cutting position d and the burr generation rate changes scarcely even if the cutting condition changes slightly, and so there is such a technical advantages that the generation of burr can be suppressed depending on the cutting position.

When the value of the cutting position d is made larger, the connection area of the external connection terminal 3 becomes smaller. As clear from FIG. 6, if the cutting position ratio (d/R) is set to be not larger than 0.7, that is, the height H is not smaller than 0.3 R, it is possible to make the connection area (inner peripheral area) of the external connection terminal 3 of the substantially semicircular concave arc shape not less than ½ of the inner peripheral area obtained by divining the through hole by two. Accordingly, practically sufficient connection area and connection intensity can be ensured.

Although, in the aforesaid embodiment, the explanation was made as to the case of cutting and dividing such a resin substrate provided with through holes each having an electrode film on the inner wall thereof, the present invention is not limited thereto, and the present invention may be applied to other insulating substrate.

The present invention is also applicable to the case of cutting and dividing such an insulating substrate made from resin or the like provided with blind holes each having an electrode film on the inner wall thereof instead of through holes.

Although the explanation has been made as to the embodiment of the present invention, the present invention is not limited thereto but various changes and modification may be made within the scope of claims as obvious for those skilled in the art.

As described above, the surface mounted electronic parts according to the present invention has the plurality of external connection terminals, wherein each of the through holes or blind holes formed in the substrate each having the electrode film on the inner surface thereof is cut and divided into two through holes or blind holes each of substantially semicircular arc shape through dicing processing using the rotating blade, and one of the divided through holes or blind holes of substantially semicircular arc shape is used as an external connection terminal of substantially semicircular concave arc shape, and in that when the dicing processing the center of rotating blade is shifted from the center of the-through holes or the blind holes. According to such an arrangement, it is possible to provide an accurate (high in accuracy of shape and high in surface accuracy) and homogeneous external connection terminal capable of suppressing or minimizing the generation of burr at an electrode film.

Further, when the height H is set to be not smaller than 0.3 R, it is possible to make the connection area (inner peripheral area) of the external connection terminal of the substantially semicircular concave arc shape not less than ½ of the inner peripheral area obtained by divining the through hole by two. Accordingly, practically sufficient connection area and connection intensity can be ensured.

What is claimed is:

1. A manufacturing method for manufacturing a substrate for mounting electronic parts, comprising:

forming a substrate having at least one electronic parts portion capable of receiving electronic parts;

forming holes in a periphery region of said at least one electronic parts portion;

forming an electrode film on an inner surface of said holes thereby forming electrode holes each having a hole center and an inner radius R; and cutting said substrate with a blade through said holes at a blade position offset from said hole centers toward said at least one electronic parts portion so as to form concave arcs each having a height H=R−d, wherein d is a distance between one of said hole centers and a surface of said blade facing said at least one electronic parts portion, H≦0.3 R, and wherein the step of cutting said substrate is performed such that each concave arc formed on said substrate has essentially a same height.

2. The manufacturing method according to claim 1, wherein the cutting step comprises cutting with the blade through said holes at the blade position offset from said hole centers by more than 30 μm.

3. The manufacturing method according to claim 2, wherein forming said electrode film comprises forming the electrode film having a thickness in a range from 10 to 30 μm.

4. The manufacturing method according to claim 2, wherein the cutting step comprises cutting with the blade having a thickness in a range from 30 to 60 μm.

5. The manufacturing method according to claim 1, wherein cutting comprises cutting with a blade through said holes at a blade position offset from said hole centers by more than 30 μm, and less than 70% of R.

6. The manufacturing method according to claim 5, wherein forming said electrode film comprises forming the electrode film having a thickness in a range from 10 to 30 μm.

7. The manufacturing method according to claim 5, wherein the cutting step comprises cutting with the blade having a thickness in a range from 30 to 60 μm.

8. The manufacturing method according to claim 1, wherein forming said electrode film comprises forming the electrode film having a thickness in a range from 10 to 30 μm.

9. The manufacturing method according to claim 1, wherein the cutting step comprises cutting with the blade having a thickness in a range from 30 to 60 μm.

10. A substrate for mounting electronic parts, manufactured by a method comprising:

forming a substrate having at least one electronic parts potion capable of receiving electronic parts;

forming holes in a periphery region of said at least one electronic parts portion;

forming an electrode film on an inner surface of said holes thereby forming electrode holes each having a hole center and an inner radius R; and cutting said substrate with a blade through said holes at a blade position offset from said hole centers toward said at least one electronic parts portion so as to form concave arcs each having a height H=R−d, wherein d is a distance between one of said hole centers and a surface of said blade facing said at least one electronic parts portion, H≦0.3 R, and wherein the step of cutting said substrate is performed such that each concave arc formed on said substrate has essentially a same height.

* * * * *